United States Patent
Shin et al.

(10) Patent No.: US 8,304,067 B2
(45) Date of Patent: Nov. 6, 2012

(54) METHOD OF FABRICATING LIQUID FILM, METHOD OF ARRANGING NANO PARTICLES AND SUBSTRATE HAVING LIQUID THIN FILM FABRICATED USING THE SAME

(75) Inventors: Hyeon Jin Shin, Suwon-si (KR); Jaeyoung Choi, Suwon-si (KR); Seonmi Yoon, Yongin-si (KR); Byung Do Oh, Suwon-si (KR); JaiYong Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 925 days.

(21) Appl. No.: 12/039,248

(22) Filed: Feb. 28, 2008

(65) Prior Publication Data
US 2009/0068374 A1 Mar. 12, 2009

(30) Foreign Application Priority Data
Sep. 7, 2007 (KR) .................. 10-2007-0090925

(51) Int. Cl.
*B32B 5/16* (2006.01)

(52) U.S. Cl. ....................................... 428/323

(58) Field of Classification Search .......... 428/323
See application file for complete search history.

(56) References Cited

U.S. PATENT DOCUMENTS

| 6,369,954 B1 * | 4/2002 | Berge et al. ................. 359/666 |
| 2006/0151754 A1 * | 7/2006 | Choi et al. ................. 252/500 |
| 2007/0170059 A1 | 7/2007 | Lee et al. |

FOREIGN PATENT DOCUMENTS

| JP | 2004287008 | 10/2004 |
| JP | 2006-058901 A | 3/2006 |
| KR | 10-2007-0020649 A | 2/2007 |
| WO | WO 2007113637 A1 * | 10/2007 |

OTHER PUBLICATIONS

Berry et al., Low voltage electrowetting using thin fluoropolymer films, Aug. 10, 2006, Journal of Colloid and Interface Science 303 (2006), pp. 517-524.*

* cited by examiner

*Primary Examiner* — Elizabeth A Robinson
(74) *Attorney, Agent, or Firm* — Cantor Colburn LLP

(57) ABSTRACT

A method of fabricating a liquid film is provided. The method comprises the steps of applying hydrophilic liquid onto a substrate with an electrode formed thereunder, covering the hydrophilic liquid with a protection film comprising hydrophobic liquid, dispersing surfactant for reducing the surface tension between the hydrophilic liquid and the protection film, and applying voltage to the hydrophilic liquid and the electrode to wet the substrate with the hydrophilic liquid. With the surfactant and the electro-wetting principle, a contact angle between the hydrophilic liquid and the substrate is controlled. The liquid film having a uniform thickness in nano size is thus formed on the substrate. The protection film prevents the evaporation of the liquid film in the air to thereby secure the stability of the liquid film.

7 Claims, 5 Drawing Sheets

METHOD OF FABRICATING LIQUID FILM, METHOD OF ARRANGING NANO PARTICLES AND SUBSTRATE HAVING LIQUID THIN FILM FABRICATED USING THE SAME

CROSS-REFERENCE TO RELATED APPLICATIONS

This application claims all benefits of Korean Patent Application No. 10-2007-0090925 filed on Sep. 7, 2007 in the Korean Intellectual Property Office, the disclosures of which are incorporated herein by reference.

BACKGROUND OF THE INVENTION

1. Field of the Invention

The present invention relates to a method of fabricating a liquid film, a method of arranging nano particles and a substrate having a liquid thin film fabricated using the same, and more particularly to a method of fabricating a liquid film having a constant size in nano size, a method of arranging nano particles and a substrate having a liquid thin film fabricated using the same.

2. Description of the Prior Art

An electro wetting means a phenomenon that electric charges existing on an interface are controlled to thereby change surface tension at the interface. Using such electro wetting, micro liquid and micro particles in liquid can be controlled so that researches are recently conducted to diverse products using electro wetting.

As a field to which electro wetting is applicable, there are a liquid lens, a display device, a memory, a switch, an optical device, a liquid magnet, and an MEMS. Particularly, the display device using electro wetting has an advantage in that power consumption is lower than existing liquid crystal display. Further, an auto-focus liquid lens using electro wetting has many advantages of miniaturization, rapid response speed, and low power consumption as compared to a driving mode of existing lens.

A method of controlling liquid and micro particles in liquid using electro wetting is used in forming a liquid film on a substrate and arranging the micro particles thereon. For example, the liquid film is formed in a display device, so that color elements of Red, Green, Blue, etc. can be selectively and densely arranged on a display unit of the substrate.

The formation of the liquid film on the substrate is not easy due to surface tension acting at an interface between the substrate and the liquid applied to the substrate. Thus, if different voltages are respectively applied to the substrate and the liquid applied to the substrate using the electro wetting principle, the surface tension between the substrate and the liquid is reduced so that the substrate can be wetted with the liquid.

However, in case where nano size liquid film is formed on the substrate, since the amount of the liquid applied to the substrate is quite a small, it has a limit to reduce the surface tension with only application of voltage. Thus, it is very difficult for the nano size liquid film to constantly wet the whole surface of the substrate, and the liquid film formed on the substrate is ready to be exposed to air and thus be evaporated, so that the thickness of the liquid film cannot be kept constant.

SUMMARY OF THE INVENTION

The present invention has been made to solve the foregoing problems of the prior art and therefore an object of the present invention is, to provide a method of fabricating a liquid film having a constant thickness in nano size.

Another object of the present invention is to provide a method of arranging nano particles using the liquid film fabrication method.

In accordance with an aspect of the present invention, there is provided a method of fabricating a liquid film comprising the steps of: applying hydrophilic liquid onto a substrate with an electrode formed thereunder; covering the hydrophilic liquid with a protection film comprising hydrophobic liquid; dispersing surfactant for reducing the surface tension between the hydrophilic liquid and the protection film; and applying voltage to the hydrophilic liquid and the electrode to wet the substrate with the hydrophilic liquid.

In case where the nano size liquid film is formed on the substrate, since the amount of the hydrophilic liquid applied onto the substrate is quite a small, a liquid film cannot be uniformly formed on the whole surface of the substrate, thereby forming an island. Thus, the uniformity in thickness of the liquid film cannot be guaranteed.

To form a liquid film having a uniform thickness, an angle between the hydrophilic liquid and the substrate should be controlled to be zero. Voltage applied to the hydrophilic liquid and the electrode and the surfactant can allow the angle between the hydrophilic liquid and the electrode to have zero.

Further, the protection film applied on the liquid film prevents that the liquid film is brought into direct contact with air and thus is evaporated, thereby being made uneven. Furthermore, the surfactant makes it possible to maintain the interface between the liquid film and the protection film to be uniform.

The surfactant is amphiphilic polymer having oleophilic group and hydrophilic group, and the hydrophilic group of the surfactant and the hydrophilic liquid applied with voltage have polarities opposite to each other. When voltage having the polarity opposite to that of the hydrophilic group of the surfactant is applied to the electrode, the control to an interface between the hydrophilic liquid and the protection film can be obtained more efficiently. Further, it is preferable that the hydrophobic liquid be a material having the higher boiling point and the lower vapor pressure relative to those of the hydrophilic liquid.

If the hydrophilic liquid is heated after applied with voltage, the thickness thereof can be controlled. Since the boiling point of the hydrophobic liquid is higher than that of the hydrophilic liquid, even when the hydrophilic liquid is heated, the hydrophobic liquid may not be evaporated.

In accordance with another aspect of the present invention, there is provided a method of arranging nano particles using the liquid film fabrication method, the arranging method comprising the steps of: applying hydrophilic liquid containing the nano particles onto a substrate with an electrode formed thereunder; covering the hydrophilic liquid with a protection film comprising hydrophobic liquid; dispersing surfactant for reducing the surface tension between the hydrophilic liquid and the protection film; and applying voltage to the hydrophilic liquid and the electrode to arrange the nano particles on the substrate.

If the hydrophilic liquid is heated after applied with voltage, the density of the nano particles can be controlled. The nano particle can have a shape of a nano dot, a nano wire, or a nano rod.

The nano particle is a conductive particle of metal, metal oxide, or quantum dot. Further, the nano particle is a magnetic material, so that if a magnetic field is applied between both ends of the hydrophilic liquid film, the nano particles can be arranged parallel in the same orientation. If the hydrophilic liquid is cured after the nano particles are arranged, the arrangement of the nano particles can be fixed.

In accordance with still another aspect of the present invention, there is provided a liquid thin film substrate comprising: a substrate; an electrode formed under the substrate; a liquid film comprising hydrophilic liquid and wetting on the substrate with voltage applied from exterior; a protection film comprising hydrophobic liquid and covering the liquid film; and a surfactant reducing the surface tension between the liquid film and the protection film, thereby keeping the liquid film uniform.

The surfactant is amphiphilic polymer having oleophilic group and hydrophilic group, and the hydrophilic group of the surfactant and the liquid film have polarities opposite to each other. The hydrophobic liquid has the higher boiling point and the lower vapor pressure relative to those of the hydrophilic liquid.

The liquid thin film substrate further comprises nano particles contained in the liquid film so as to be arranged on the substrate. The nano particles may be conductive particles, or magnetic materials arranged in certain orientation with an external magnetic field.

According to the liquid film fabrication method, the liquid film having uniform thickness in nano size can be formed. Further, the thickness of the liquid film can be stably maintained even in air by the protection film.

Further, according to the nano particles arranging method using the liquid film fabrication method, the nano particles contained in the liquid film can be uniformly arranged on the substrate. In addition, the orientation and the structure of the arrangement of the nano particles can be controlled, so that the nano particles are applicable to various areas such as a memory, an optical device, or a switch.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, the preferred embodiments of the present invention will be described in detail. However, the present invention is not limited to the embodiments below, but may be realized in diverse forms within accompanying claims. The embodiments are merely provided for illustrative purpose and allowing the skilled in the art to easily perform the present invention. Accordingly, it should not be construed that the scope of the present invention is limited to the embodiment described below. Further, in connection with the drawings provided together with below embodiments, the dimension of the respective regions is simplified or somewhat exaggerated for intensifying definite explanation, and like numerals refer to like elements.

Figure 1A:
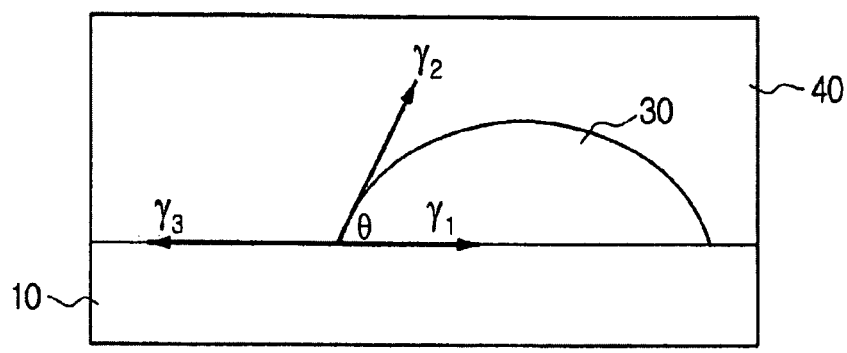
FIG. 1A is a sectional view illustrating a principle of forming a liquid film according to an embodiment of the present invention.
Figure 1B:
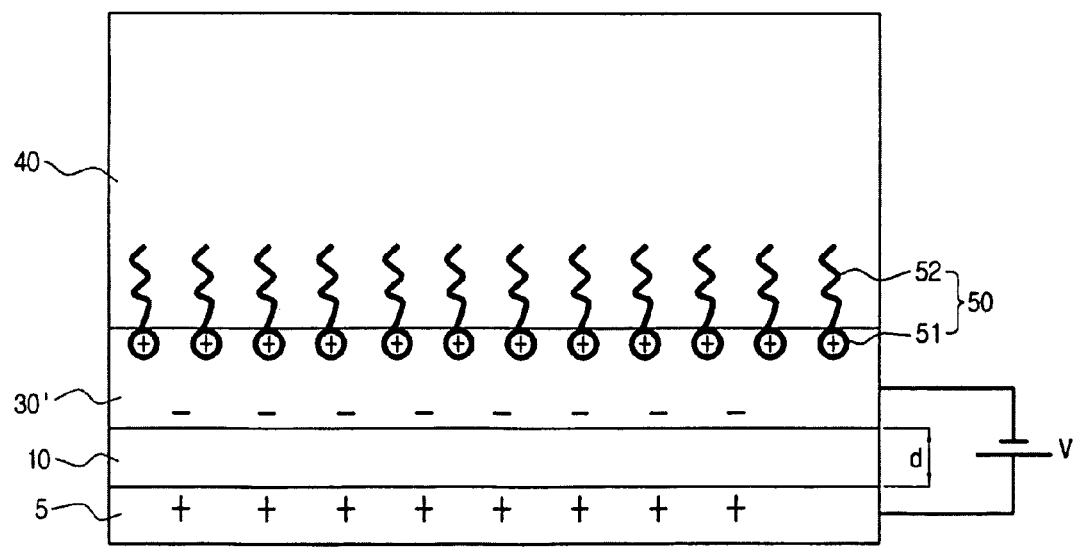
FIG. 1B is a sectional view illustrating a procedure of forming a liquid film according to an embodiment of the present invention.

FIG. 1A is a sectional view illustrating a principle of forming a liquid film according to an embodiment of the present invention, and FIG. 1B is a sectional view illustrating a procedure of forming a liquid film according to an embodiment of the present invention.

Referring to FIGS. 1A and 1B, in order to form a liquid film 30' on a substrate 10, hydrophilic liquid 30 is applied to the substrate 10, and a protection film 40 is formed on the hydrophilic film 30 to protect the same. The protection film 40 comprises hydrophobic liquid.

Meanwhile, as illustrated in FIG. 1A, first surface tension γ1 acts at an interface between the substrate 10 and the hydrophilic liquid 30, second surface tension γ2 acts at an interface between the hydrophilic liquid 30 and the protection film 40, and third surface tension γ3 acts at an interface between the substrate 10 and the protection film 40. An angle between the hydrophilic liquid 30 and the substrate 10 when first to third surface tensions γ1, γ2, and γ3 are in equilibrium is called a contact angle θ. The contact angle θ is expressed as an equation 1 below.

$$\cos\theta = \frac{\gamma_3 - \gamma_1}{\gamma_2} \qquad \text{Equation 1}$$

In order to form the liquid film 30' in nano size, particularly tens to a few nano size, on the substrate 10, the first to third surface tensions γ1, γ2, and γ3 should be regulated such that the contact angle θ approaches zero. That is, the first and second surface tensions γ1 and γ2 should be regulated so as to be decreased to thereby increase the third surface tension γ3.

Hereinafter, a procedure of forming the liquid film 30' through reducing the first and second surface tensions γ1 and γ2 will now be explained.

As illustrated in FIG. 1B, an electrode 5 is formed under the substrate 10. The electrode 5 comprises a conductive material, such as metal including Au, Cu, or Al, metal oxide including ITO or $SnO_2$, semiconductor including Ge, Si, or GaAs, and carbon including graphite or diamond. The electrode 5 may be entirely or partially formed under the substrate 10. Meanwhile, the substrate 10 comprises an insulating material such as glass or plastic.

Voltage V is applied to the hydrophilic liquid 30 and the electrode 5 to wet the substrate 10 with the hydrophilic liquid 30 to thereby form the liquid film 30'. This procedure uses an electro-wetting principle so that charge density in the interface between the substrate 10 and the hydrophilic liquid 30 is changed to thereby regulate the first surface tension γ1. Specifically, the hydrophilic liquid 30 and the electrode 5 are respectively applied with charges having opposite polarities, wherein for example, the hydrophilic liquid 30 is applied with negative charges, and the electrode 5 with positive charges. Thus, opposite-polarities charges are respectively accumulated in the interface between the electrode 5 and the substrate 10, and the interface between the substrate 10 and the hydrophilic liquid 30, so that the first surface tension γ1 is reduced due to electric attraction. The first surface tension γ1 is reduced by the amount expressed as an equation 2 below.

$$-\varepsilon_0 \frac{\varepsilon_r}{2d} V^2 \qquad \text{Equation 2}$$

Herein, ∈ is dielectric constant of the substrate 10, d is a thickness of the substrate 10. According to the equation 2, it can be known that as the voltage V increases and the thickness of the substrate 10 decreases, the first surface tension γ1 decreases. As the first surface tension γ1 decreases, the contact angle θ decreases, and the surface area of the hydrophilic liquid 30 relative to the substrate 10 is enlarged. The hydrophilic liquid 30 is enlarged in surface area on the substrate 10 in correspondence with the area of the electrode 5. Thus, if the area of the electrode 5 is regulated, the area of the hydrophilic liquid 30 can be regulated. Further, the electrode 5 is formed partially so that the liquid film 30' can be selectively formed.

Meanwhile, a surfactant 50 is dispersed so as to reduce the second surface tension γ2 between the hydrophilic liquid 30 and the protection film 40. The surfactant 50 may be dispersed while being mixed in the hydrophilic liquid 30 or the hydrophobic liquid 40.

The surfactant 50 is an amphiphilic polymer having a hydrophilic group 51 and an oleophilic group 52. With repulsion between the oleophilic group 52 and the hydrophilic liquid 30, the surfactant 50 is positioned on the interface between the hydrophilic liquid 30 and the protection film 40, with the result that the second surface tension γ2 between the hydrophilic liquid 30 and the protection film 40 is reduced.

The surfactant 50 is any one or more of an anionic surfactant, a cationic surfactant, an amphoteric surfactant, and a unionic surfactant. In case of the anionic surfactant, when the surfactant 50 is ionized in the hydrophilic liquid 30, the hydrophilic group 51 becomes anions. For example, benzalkonium chloride soap, alkylbenzene sulfonate, and others pertain to such an anionic surfactant. In case of the cationic surfactant, when the surfactant 50 is ionized in the hydrophilic liquid 30, the hydrophilic group 51 becomes cations. Amine halide, quaternary ammonium salt, alkyl pyridinium, and others pertain thereto. In case of the amphoteric surfactant, when the surfactant 50 is dissociated in the hydrophilic liquid 30, the hydrophilic group 51 becomes anions or cations. Amino acid pertains thereto. In case of the unionic surfactant, the surfactant 50 is not dissociated in the hydrophilic liquid 30, wherein polyethylene glycol and others pertain thereto.

Meanwhile, if the hydrophilic group 51 and the hydrophilic liquid 30 applied with voltage V have polarities opposite to each other, the second surface tension γ2 is reduced furthermore due to electrical attraction between the hydrophilic group 51 and the hydrophilic liquid 30. Thus, the surfactant 50 is preferably an ionic surfactant having polarity opposite to that of the hydrophilic liquid 30. In the present embodiment, since the hydrophilic liquid 30 has negative charge, the surfactant 50 is preferably a cationic surfactant.

As set forth before, since the first and second surface tensions γ1 and γ2 are reduced by the electro-wetting principle and the surfactant 50, the contact angle θ is reduced. Thus, the liquid film 30' having uniform thickness in nano size can be formed on the substrate 10. Further, the protection film 40 prevents the liquid film 30' from being evaporated to thereby keep the liquid film 30' stable.

Meanwhile, the hydrophilic liquid 30 and the hydrophobic liquid have different boiling point, vapor pressure, and density. The boiling point of the hydrophobic liquid is larger than that of the hydrophilic liquid 30, and the vapor pressure of the hydrophobic liquid is lower than that of the hydrophilic liquid. If the hydrophilic liquid 30 is water, the boiling point of the hydrophobic liquid is larger than that of water, and the vapor pressure of the hydrophobic liquid is lower than that of water.

Particularly, the hydrophobic liquid comprises a nonvolatile material having high boiling point so as not to be evaporated when applied on the substrate 10, and should be applied in a certain thickness on the substrate 10.

Meanwhile, voltage application may be performed to the hydrophilic liquid 30 after the hydrophilic liquid 30 and the hydrophobic liquid are applied on the substrate 10, or otherwise, after only the hydrophilic liquid is applied on the substrate 10 and before the hydrophobic liquid is applied. In the present embodiment, description is made of the former case.

Hereinafter, a method of arranging nano particles on the substrate 10 using the method of forming the liquid film 30' will now be explained. In the drawings described below, the surfactant 50 between the hydrophilic liquid 30 and the protection film 40 is omitted to illustrate.

Figure 2A:
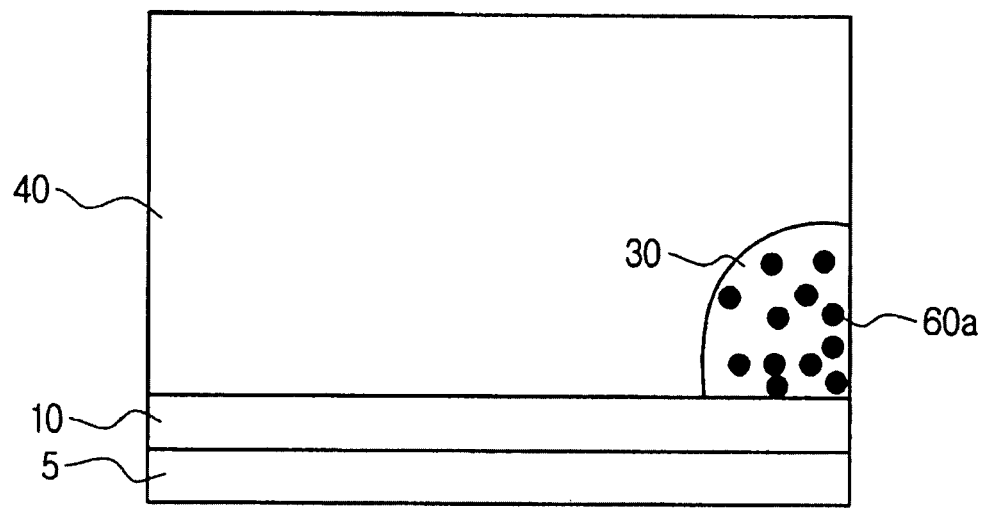
FIGS. 2A and 2B are sectional views illustrating a procedure of arranging nano particles using the liquid film formation method according to the embodiment of the present invention.
Figure 2B:
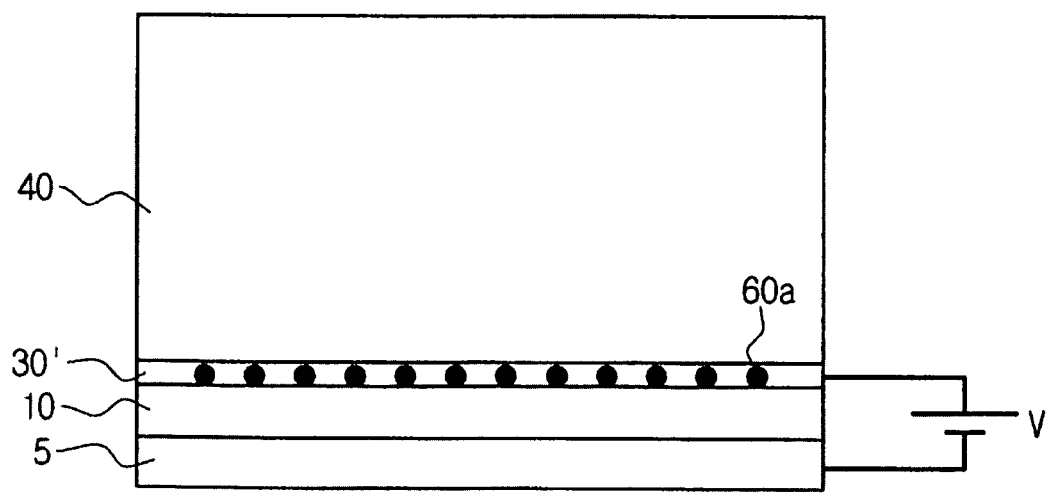

FIGS. 2A and 2B are sectional views illustrating a procedure of arranging nano particles using the liquid film formation method according to the embodiment of the present invention. In FIGS. 2A and 2B, the elements similar to those of FIGS. 1A and 1B are denoted as the same reference numerals as those, and the detailed description thereof will be omitted.

Referring to FIGS. 2A and 2B, a procedure of forming nano particles 60a on the substrate 10 is similar as described in FIGS. 1A and 1B, excluding a step of applying, on the substrate 10, the hydrophilic liquid 30 containing the nano particles 60a.

Specifically, the hydrophilic liquid 30 containing the nano particles 60a is applied on the substrate 10 with the electrode 5 formed thereunder. Next, the protection film 40 is formed to cover the hydrophilic liquid 30. The surfactant 50 is dispersed so as to reduce the second surface tension γ2 between the hydrophilic liquid 30 and the protection film 40. Voltage V is applied to the hydrophilic liquid 30 and the electrode 5 to thereby form the liquid film 30' on the substrate.

As illustrated in FIG. 1B, on the substrate 10, the liquid film 30' that has a uniform thickness in nano size due to the electro-wetting principle and the surfactant 50 is formed. Further, the hydrophilic liquid 30 is spread on the substrate 10 so that the nano particles 60a contained in the hydrophilic liquid 30 are dispersed and uniformly arranged on the substrate 10.

Meanwhile, if the electrode 5 is partially formed under the substrate 10, the nano particles 60a may be selectively arranged on the substrate 10. The selective arrangement of the nano particles 60a using such a liquid film formation method is applicable to a memory, a switch, an optical device, a display device, or so on. Further, since the thickness of the liquid film 30' has a few to tens nano size, the display device employing the liquid film 30' can be made thinner and lighter.

Further, the liquid thin film substrate 10 fabricated by using the above liquid film formation method includes the substrate 10, the electrode 5, the liquid film 30', the protection film 40, the surfactant 50, and the nano particles 60a.

The nano particle 60a may have a shape of a nano dot, a nano wire, or a nano rod. The present embodiment exemplarily illustrates the case where the nano particles 60a having a shape of nano dot are arranged on the substrate 10. The nano particle 60a may comprise one or more materials selected from a group including a conductive material, a biomaterial, and a magnetic material.

The conductive material comprises metal including Au, Cu, or Al, a metal oxide including ITO and $SnO_2$, a semiconductor including Ge, Si, and GaAs, a quantum dot, and a carbonic material including carbon nanotube, graphene, and diamond. The biomaterial comprises one or more materials selected from a group including hexane, protein, peptide, bacteria, virus, and mammal cell. The magnetic material comprises iron oxides including $Fe_2O_3$ and $Fe_3O_4$, ferrite, or an alloy including FePt and CoPt.

Figure 3A:
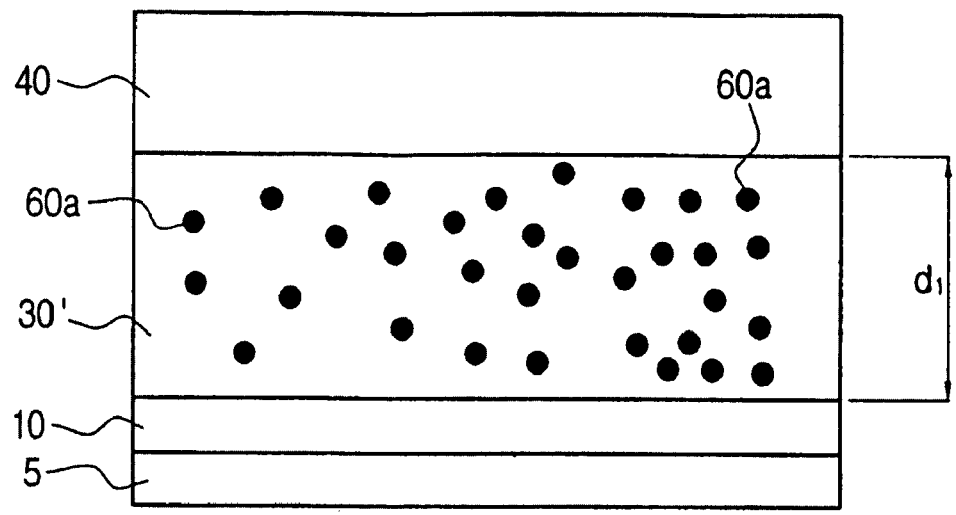
FIGS. 3A and 3B are sectional views illustrating a method of regulating a thickness of the liquid film illustrated in FIG. 2B.
Figure 3B:
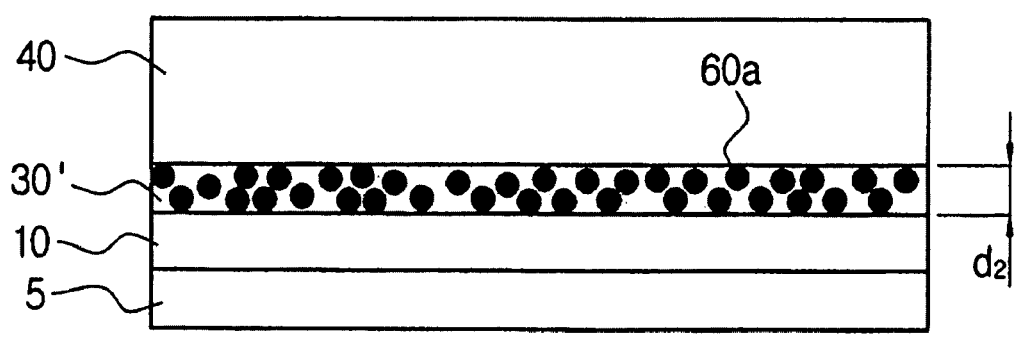

FIGS. 3A and 3B are sectional views illustrating a method of regulating a thickness of the liquid film illustrated in FIG. 2B. In FIGS. 3A and 3B, the elements similar to those of FIG. 2B are denoted as the same reference numerals as those, and the detailed description thereof will be omitted.

Referring again to FIGS. 2A and 2B, since the boiling point of the hydrophilic liquid 30 is lower than that of the hydrophobic liquid, the thickness of the liquid film 30' can be regulated using such a difference between the boiling points. Further, through regulating the thickness of the liquid film 30', the density of the nano particles 60a contained in the liquid film 30' can be controlled.

Specifically, as illustrated in FIG. 3A, after the liquid film 30' having a first thickness d1 is formed on the substrate 10, the liquid film 30' is heated so as to evaporate the hydrophilic liquid 30. As illustrated in FIG. 3B, through the evaporation of the hydrophilic liquid 30, the thickness of the liquid film 30' is reduced to a second thickness d2. With the reduction in thickness of the liquid film 30' from the first thickness d1 to the second thickness d2, the nano particles 60a dispersed in the liquid film 30' can be increased.

Figure 4:
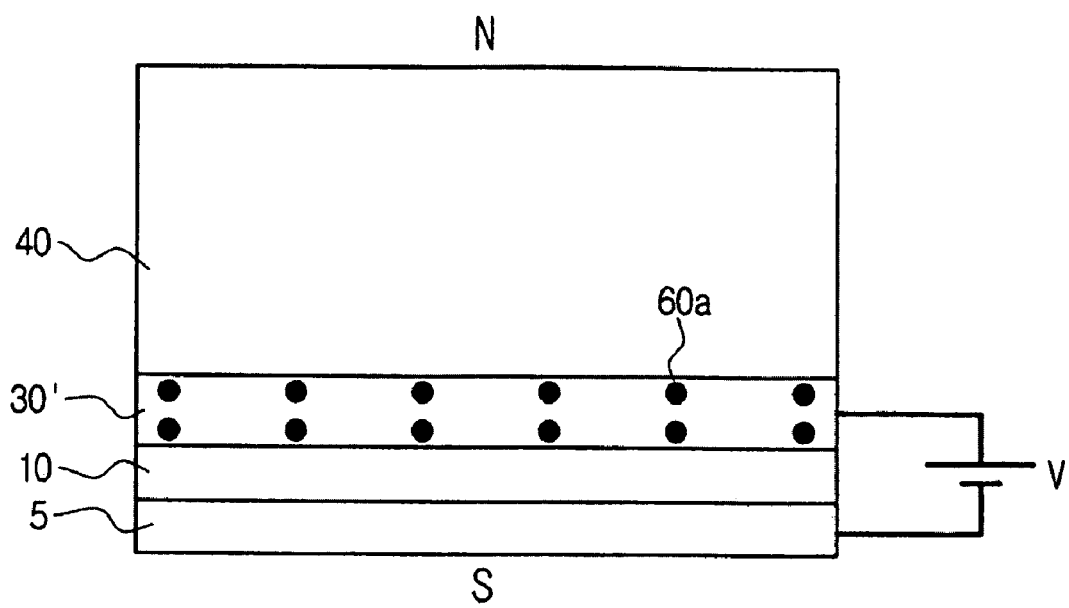
FIG. 4 is a sectional view illustrating a method of regulating a shape of arrangement of the nano particles illustrated in FIG. 2B.

FIG. 4 is a sectional view illustrating a method of regulating a shape of arrangement of the nano particles illustrated in FIG. 2B.

Referring to FIG. 4, the construction illustrated is identical to that illustrated in FIG. 2B, excluding that the shape of arrangement of the nano particles 60a on the substrate 10 is different from that illustrated in FIG. 2B. The present embodiment describes a method of changing the shape of arrangement of the nano particles 60a using a magnetic filed. The nano particles 60a comprise magnetic materials.

A magnetic filed is applied to both upper and lower ends of the liquid film 30' such that the upper end and the lower end have opposite polarities. With the magnetic field, the nano particles 60a are arranged perpendicular to the substrate 10 in the liquid film 30'. Herein, as described with reference to FIGS. 3A and 3B, the thickness of the liquid film 30' is regulated through heating the same so that the number of the vertical layers of the nano particles 60a arranged can be controlled. In the present embodiment, the thickness of the liquid film 30' is controlled to have a size two to three times the diameter of the nano particle 60a. Thus, as illustrated in FIG. 4, the nano particles 60a are arranged in two-layered structure.

Meanwhile, if the thickness of the liquid film 30' is formed three or more times the diameter of the nano particle 60a, and a magnetic field is applied to the liquid film 30', the nano particles 60a can be arranged in three or more layered structure.

Further, after the nano particles 60a are arranged in a certain shape, when the liquid film 30' is cured, the arrangement of the nano particles 60a can be fixed. Herein, the hydrophilic liquid 30 further contains curing agents for curing the liquid film 30'.

Figure 5A:
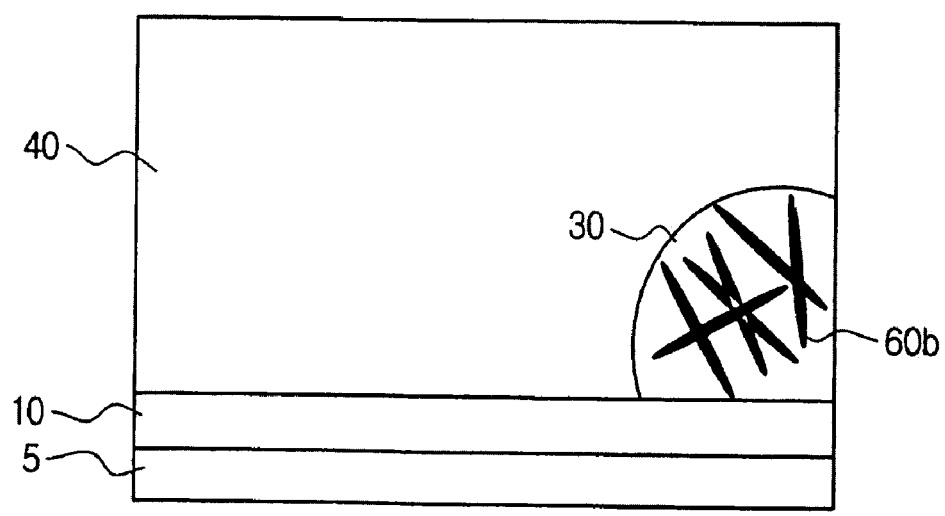
FIGS. 5A to 5C are sectional views illustrating a procedure of arranging nano wires or nano rods on the substrate using the liquid film formation method.
Figure 5B:
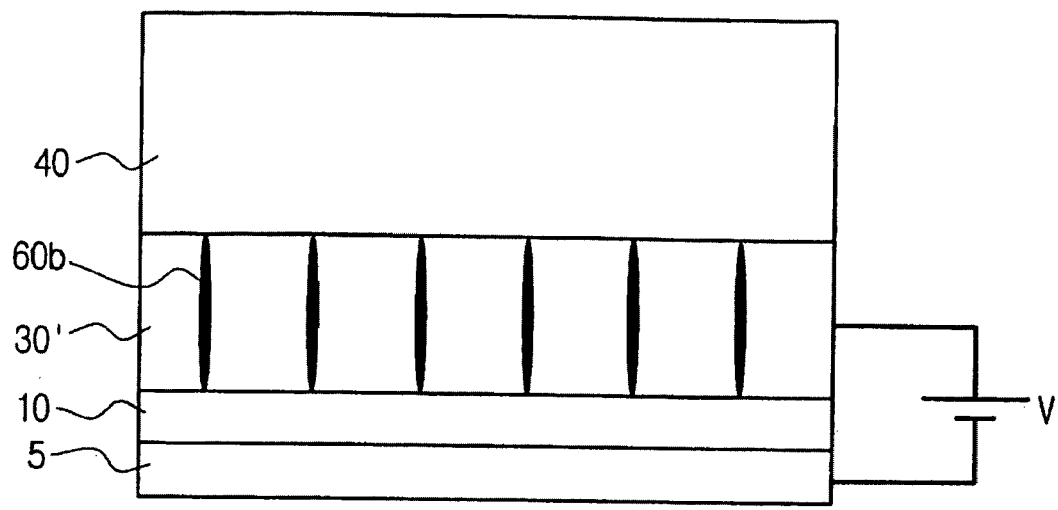
Figure 5C:
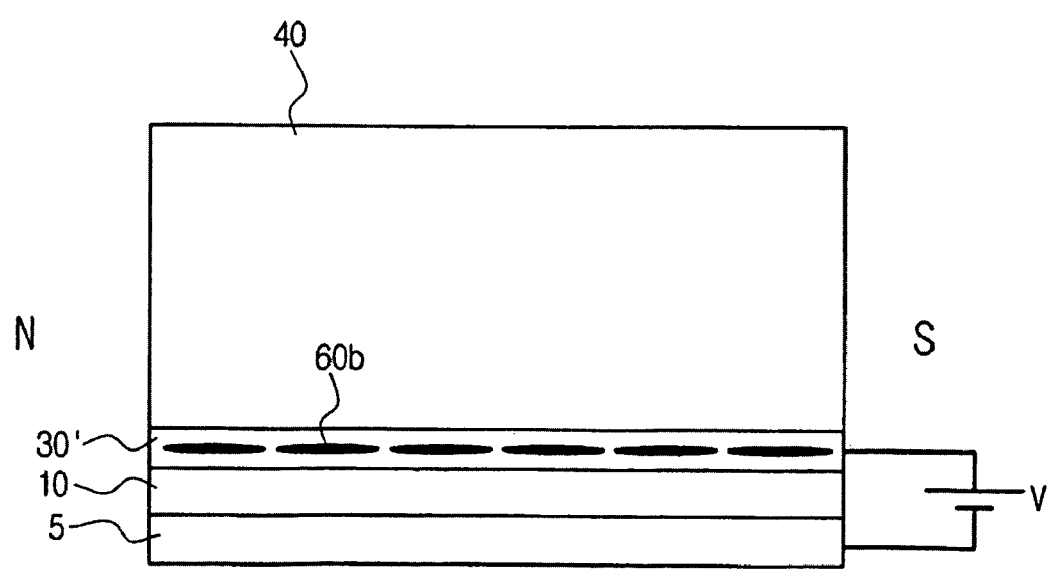

FIGS. 5A to 5C are sectional views illustrating a procedure of arranging nano wires or nano rods on the substrate using the liquid film formation method. In FIGS. 5A to 5C, the elements similar to those of FIGS. 1A to 3B are denoted as the same reference numerals as those, and the detailed description thereof will be omitted.

In the present embodiment, the construction is identical to that described before, excluding that the nano particles 60b are magnetic particles having a shape of nano rods or nano wires.

Referring to FIGS. 5A and 5B, the hydrophilic liquid 30 containing the nano particles 60b and the surfactant 50 is applied on the substrate 10, and the hydrophobic liquid is applied on the hydrophilic liquid 30 to thereby form the protection film 40. Voltage V is applied to the hydrophilic liquid 30 and the electrode 5. With the electro-wetting principle and the surfactant 50, the liquid film 30' having a uniform thickness is formed on the substrate 10, and the nano particles 60b are uniformly arranged in the liquid film 30'.

As illustrated in FIG. 5B, if a magnetic filed is applied to the liquid film 30' such that the upper end and the lower end of the liquid film 30' have opposite polarities, the nano particles 60b are arranged perpendicular to the substrate 10 due to the magnetic field applied.

Further, as illustrated in FIG. 5C, if a magnetic filed is applied to both left and right ends of the liquid film 30' such that the left end and the right end of the liquid film 30' have opposite polarities, the nano particles 60b are arranged horizontally to the substrate 10 due to the magnetic field applied. Herein, if the thickness of the liquid film 30' is regulate to be smaller than that of the nano particle 60b, the nano particles 60b can be horizontally arranged in single layered structure. Then, the liquid film 30' is cured to fix the arrangement of the nano particles 60b.

While the present invention has been described with reference to the particular illustrative embodiments and the accompanying drawings, it is not to be limited thereto but will be defined by the appended claims.

It is to be appreciated that those skilled in the art can substitute, change or modify the embodiments into various forms without departing from the scope and spirit of the present invention.

What is claimed is:

1. A substrate coated by a liquid thin film comprising:
    a substrate;
    an electrode formed under the substrate;
    a liquid film comprising
        a hydrophilic liquid which wets the substrate, and
        nanoparticles;
    a protection film comprising a hydrophobic liquid which covers the liquid film; and
    a surfactant which reduces a surface tension between the liquid film and the protection film,
    wherein the nanoparticles comprise carbon nanotubes or graphene, and
    wherein the nanoparticles are arranged in a controlled manner on the substrate.

2. The substrate coated by a liquid thin film according to claim 1, wherein the surfactant is an amphiphilic polymer having an oleophilic group and a hydrophilic group.

3. The substrate coated by a liquid thin film according to claim 2, wherein the hydrophilic group of the surfactant and the liquid film have polarities different from each other.

4. The substrate coated by a liquid thin film according to claim 1, wherein the hydrophobic liquid is nonvolatile.

5. The substrate coated by a liquid thin film according to claim 1, wherein the nanoparticles have a shape of a nano wire, or a nano rod.

6. The substrate coated by a liquid thin film according to claim 1, wherein the nanoparticles further comprise one or more materials selected from the group consisting of a metal, a metal oxide, semiconductor, quantum dot and biomaterial.

7. A substrate coated by a liquid thin film, comprising:
a substrate;
an electrode formed under the substrate;
a liquid film comprising
  a hydrophilic liquid which wets the substrate, and nanoparticles;
a protection film comprising a hydrophobic liquid which covers the liquid film; and
a surfactant which reduces a surface tension between the liquid film and the protection film,
wherein
  the nanoparticles are arranged in a controlled manner on the substrate,
  the hydrophobic liquid has a boiling point which is higher than a boiling point of the hydrophilic liquid,
  the hydrophobic liquid has a vapor pressure which is lower than a vapor pressure of the hydrophilic liquid, and
  the nanoparticles comprise carbon nanotubes or graphene.

* * * * *